(12) United States Patent
Lee et al.

(10) Patent No.: US 9,691,540 B2
(45) Date of Patent: Jun. 27, 2017

(54) HYBRID PASSIVE DEVICE AND HYBRID MANUFACTURING METHOD

(71) Applicant: MediaTek Inc., Hsin-Chu (TW)

(72) Inventors: Tao-Yi Lee, Hsin-Chu (TW); Po-Sen Tseng, Cyonglin Township, Hsinchu County (TW); Ming-Da Tsai, Houlong Township, Miaoli County (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 14/736,653

(22) Filed: Jun. 11, 2015

(65) Prior Publication Data

US 2016/0182005 A1   Jun. 23, 2016

Related U.S. Application Data

(60) Provisional application No. 62/094,146, filed on Dec. 19, 2014.

(51) Int. Cl.
| | |
|---|---|
| *H03H 2/00* | (2006.01) |
| *H03H 7/42* | (2006.01) |
| *H01F 27/28* | (2006.01) |
| *H01L 23/522* | (2006.01) |
| *H01L 23/48* | (2006.01) |

(52) U.S. Cl.
CPC ......... *H01F 27/2847* (2013.01); *H01L 23/48* (2013.01); *H01L 23/5222* (2013.01); *H01L 23/5227* (2013.01)

(58) Field of Classification Search
CPC .................................... H01P 5/10; H03H 7/42
USPC .......................................... 333/25, 26, 24 R
See application file for complete search history.

(56) References Cited

U.S. PATENT DOCUMENTS

| | | | |
|---|---|---|---|
| 5,497,137 A | 3/1996 | Fujiki | |
| 6,396,362 B1 | 5/2002 | Mourant et al. | |
| 7,005,956 B2 * | 2/2006 | Wang | H03H 7/42 333/25 |
| 7,449,974 B2 * | 11/2008 | Lee | H01F 17/0013 333/25 |
| 7,755,447 B2 | 7/2010 | Oshima | |
| 7,892,858 B2 * | 2/2011 | Liu | H01L 23/5227 257/E21.001 |
| 8,093,959 B1 | 1/2012 | Apel | |
| 8,110,895 B2 | 2/2012 | Imaoka et al. | |

(Continued)

*Primary Examiner* — Dean Takaoka
(74) *Attorney, Agent, or Firm* — Wolf, Greenfield & Sacks, P.C.

(57) ABSTRACT

A hybrid passive device for synergizing at least one passive component which resides in at least one technology is provided. The hybrid passive device includes a first passive component and a second passive component. The first passive component resides in a first technology of the at least one technology and/or a second technology of the at least one technology, the second technology is different from the first technology, and a technology boundary is arranged between the second technology and the first technology. The second passive component of the at least one passive component is different from the first passive component. The second passive component resides in the first technology and/or the second technology, and the first passive component and the second passive component are electromagnetically coupled to each other through the technology boundary.

20 Claims, 9 Drawing Sheets

(56) References Cited

U.S. PATENT DOCUMENTS

| | | | | |
|---|---|---|---|---|
| 8,338,930 B2* | 12/2012 | Rofougaran | ........ | G06K 7/10237 |
| | | | | 257/686 |
| 8,366,009 B2* | 2/2013 | Finn | ............... | G06K 19/077 |
| | | | | 235/492 |
| 8,552,812 B2* | 10/2013 | Yen | ............... | H01L 23/5223 |
| | | | | 333/25 |
| 8,575,731 B2* | 11/2013 | Ujita | ................ | H01L 23/64 |
| | | | | 257/379 |
| 8,610,543 B2* | 12/2013 | Alicot | ............... | H04B 1/10 |
| | | | | 340/10.1 |
| 9,077,059 B2* | 7/2015 | Endo | .................. | H01P 5/10 |
| 2009/0079573 A1* | 3/2009 | Jiang | ............... | G06K 7/0008 |
| | | | | 340/572.7 |

\* cited by examiner

HYBRID PASSIVE DEVICE AND HYBRID MANUFACTURING METHOD

CROSS REFERENCE TO RELATED APPLICATIONS

This application claims the benefit of U.S. Provisional Application No. 62/094,146, filed on Dec. 19, 2014, the entirety of which is incorporated by reference herein.

BACKGROUND OF THE INVENTION

Field of the Invention

The disclosure generally relates to a hybrid passive device, and more particularly, to a hybrid passive device for synergizing at least one passive component which resides in at least one technology.

Description of the Related Art

Balanced-unbalanced devices (also referred to as balun devices) are widely used to transform an unbalanced input signal to a pair of balanced output signals or, in the reverse situation, a pair of balanced input signals to an unbalanced output signal. Balun devices are usually manufactured in a single process such as a laminated substrate, or designed by a single technology such as an integrated-passive-device (IPD).

In RF front-end modules, most of the die and laminate substrate is consumed by the balun device. Design resources are expended by passive devices for a typical matching network, especially when high impedance conversion is required. Accordingly, many metal layers and many expensive manufacturing processes are required for implementing a balun device with lots of passive devices. However, regarding the typical IC/MCM packaging, at least two different technologies are usually utilized for implementing the balun device. Manufacturing the balun device with more than two technologies is complicated and greatly increases the cost. Therefore, a hybrid passive device and a hybrid manufacturing method are needed to design a balun device by synergizing at least one passive component which resides in at least one technology. As such, the advantage of each technology is obtained and the cost is also reduced without paying penalties in terms of performance.

BRIEF SUMMARY OF THE INVENTION

In order to solve the aforementioned problem, the invention proposes a hybrid passive device and a hybrid manufacturing method for synergizing at least one passive component which resides in at least one technology. By synergizing the different technologies, the performance of the hybrid passive device can be improved. In addition, compared to the conventional method of utilizing different technologies, a lower cost can be provided by the synergizing of the hybrid passive device.

In one aspect of the invention, a hybrid passive device for synergizing at least one passive component which resides in at least one technology is provided. The hybrid passive device includes a first passive component and a second passive component. The first passive component resides in a first technology of the at least one technology and/or a second technology of the at least one technology, the second technology is different from the first technology, and a technology boundary is arranged between the second technology and the first technology. The second passive component of the at least one passive component is different from the first passive component. The second passive component resides in the first technology and/or the second technology, and the first passive component and the second passive component are electromagnetically coupled to each other through the technology boundary.

In another aspect of the invention, when the first passive component and/or the second passive component reside in both the first technology and the second technology, the first passive component and/or the second passive component which reside in both the first technology and the second technology are divided into a first sub-component which resides in the first technology and a second sub-component which resides in the second technology, and the first sub-component is connected to the second sub-component through a conductive link. Furthermore, the conductive link is composed of conductive material for carrying conductive currents and interconnecting the first technology and the second technology. In addition, the conductive link comprises a via, a solder bump or a copper pillar.

In another aspect of the invention, the first passive component and the second passive component comprise metal structures which are surrounded by dielectrics of the first technology and/or the second technology. The technology boundary is a plane for contacting the dielectrics of the first technology and/or the second technology. In another aspect of the invention, the first technology and the second technology comprise a substrate technology in which the first and second passive components reside and/or comprise a manufacturing process technology to be utilized by the first and second passive components. The substrate technology comprises a laminate substrate, an LGA substrate and/or a lead frame. Furthermore, the manufacturing process technology comprises an IPD process, a CMOS process, a compound semiconductor process and/or a package molding process. The electromagnetic coupling between the first passive component and the second passive component comprises an inductive coupling for sharing magnetic field lines and a capacitive coupling for sharing electrical coupling. In addition, the hybrid passive device is manufactured within a flip-chip package, and the hybrid passive device is a balun device for the conversion between a single end and a differential end.

In another aspect of the invention, a hybrid manufacturing method for synergizing at least one passive component which resides in at least one technology is provided. The hybrid manufacturing method includes determining a first technology and a second technology of the at least one technology and a technology boundary, arranging a first passive component of the at least one passive component which resides in the first technology and/or the second technology, and arranging a second passive component of the at least one passive component which is different from the first passive component. The second technology is different from the first technology, and a technology boundary is arranged between the second technology and the first technology. The second passive component resides in the first technology and/or the second technology, and the first passive component and the second passive component are electromagnetically coupled to each other through the technology boundary.

In still another aspect of the invention, a hybrid manufacturing method for synergizing a plurality of technologies is provided. The hybrid manufacturing method includes determining at least one requirement of the hybrid passive device, determining the technologies according to the at least one requirement, and arranging the at least one passive component which resides in the technologies according to the at least one requirement. The hybrid passive device resides in or utilizes the technologies for the synergizing of the at least one passive component.

Other aspects and features of the present invention will become apparent to those with ordinarily skill in the art upon review of the following descriptions of specific embodiments of the hybrid passive device and the hybrid manufacturing method.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are shown in detail as follows. This description is made for the purpose of illustrating the general principles of the invention and should not be taken in a limiting sense. It should be understood that the embodiments may be realized in software, hardware, firmware, or any combination thereof.

Figure 1A:
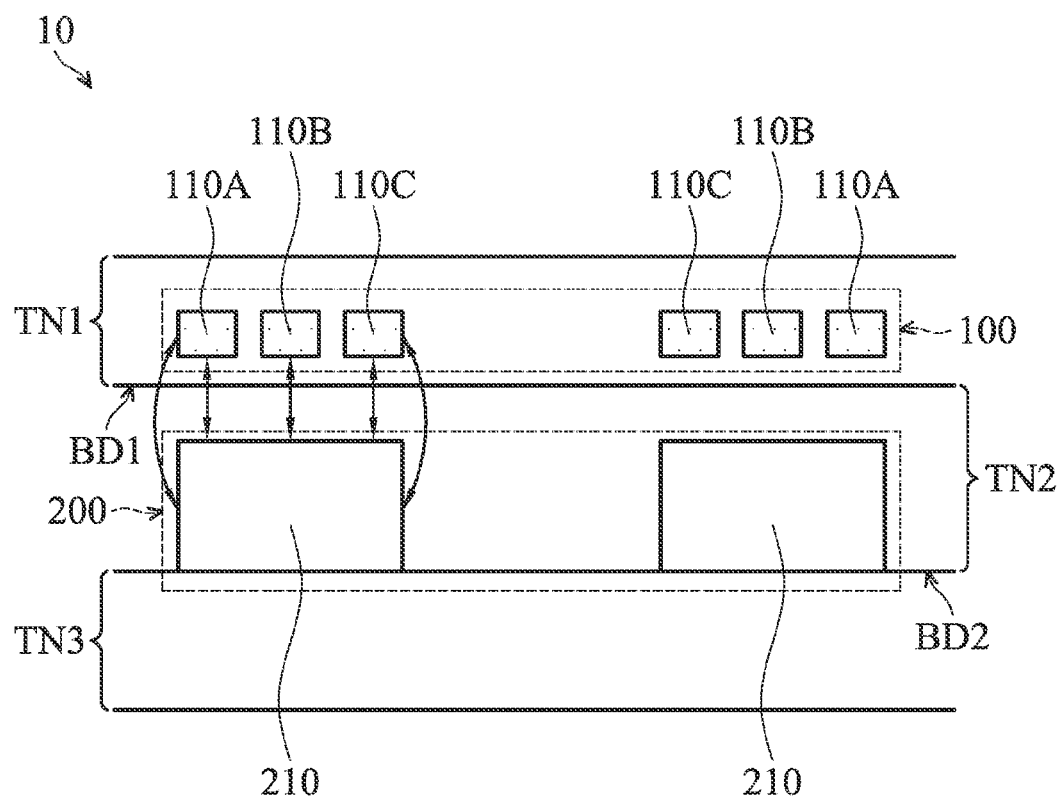
FIG. 1A is a cross-sectional view of a hybrid passive device according to an embodiment of the invention.

FIG. 1A is a cross-sectional view of a hybrid passive device 10 according to an embodiment of the invention. The hybrid passive device 10 includes at least one passive component, and each of the passive components resides in at least one technology. As shown in FIG. 1A, the hybrid passive device 10 includes the passive element 100 (the first passive element) and the passive element 200 (the second passive element). In one embodiment, the passive component 100 resides in the technology TN1 (the first technology) of the at least one technology, and the passive component 200 resides in the technology TN2 (the second technology) of the at least one technology. The passive component 100 includes three sub-components 100A, 100B and 100C, and the passive component 200 includes the sub-component 210. A technology boundary BD1 is arranged between the technologies TN1 and TN2. Furthermore, another technology TN3 is provided in the embodiment of FIG. 1A, and the technology boundary BD2 is arranged between the technologies TN2 and TN3.

In one embodiment, the first passive component and the second passive component include metal structures which are surrounded by dielectrics of the first technology and/or the second technology, and the technology boundary is a plane for contacting the dielectrics of the first technology and/or the second technology. For example, the passive components 100 and 200 could be any kind of metal structures in the form of coil, sheet, straight line, meander line, layer and metal of any arbitrary geometries. The passive components 100 and 200 could also be the combination of a plurality of metal structures and become the electronic element such as a capacitor or a inductor. In addition, the first technology and the second technology include a substrate technology in which the first and second passive components reside and/or include a manufacturing process technology to be utilized by the first and second passive components. The technologies TN1, TN2 and TN3 could be single-layered or multi-layered substrates such as laminate substrates (for example, FR4, Rogers, BT or LGA substrates) or lead frames. The technologies TN1, TN2 and TN3 could also be manufacturing processes such as an IPD manufacturing process, CMOS manufacturing process, Compound semiconductor process (for example, GaAs or InP compound semiconductor process), SOI manufacturing process, SOC manufacturing process or package molding process.

The passive components 100 and 200 reside in the technologies TN1 and TN2, which means that the passive components 100 and 200 are surrounded by dielectrics of the technologies TN1 and TN2 respectively. It could also mean that the passive components 100 and 200 are manufactured or designed by the technologies TN1 and TN2 respectively. For example, in the embodiment of FIG. 1A, the technology TN1 is IPD manufacturing process, the technology TN2 is a package molding process, and the technology TN3 is an LGA substrate. The sub-components 110A-110C of the passive component 100 are inductors which are manufactured by the IPD manufacturing process of the technology TN1. The sub-component 210 of the passive component 200 is a metal layer on the LGA substrate and resides in the package molding of the technology TN2. More specifically, as shown in FIG. 1A, the electromagnetic coupling between the passive components 100 and 200 includes an inductive coupling for sharing magnetic field lines and a capacitive coupling for sharing electrical field lines. Since the passive components 100 and 200 are arranged on different sides of the technology boundary BD1, the electromagnetic coupling between the passive components 100 and 200 passes through the technology boundary BD1 for the energy transformation by sharing the electrical field lines and magnetic field lines.

It should be noted the hybrid passive device 10 can be implemented with the hybrid manufacturing method for synergizing at least one passive component which resides in at least one technology. The hybrid manufacturing method includes determining at least one requirement of the hybrid passive device 10, determining the at least one technology TN1, TN2 and TN3 according to the at least one requirement, and arranging the at least one passive components 100 and 200 which resides in the technologies TN1 and TN2 respectively according to the at least one requirement. Specifically, the requirements are predetermined based on the design and function of the hybrid passive device 10. The predetermined requirements include the turn ratio, the inductance, the coupling factor and/or the DC resistance. According to the predetermined requirements, the hybrid passive device 10 is designed to reside in or utilize the technologies TN1, TN2 and TN3 for synergizing the passive components 100 and 200 with the technologies TN1, TN2 and TN3. For example, the three sub-components 100A-100C are high turn coils that need a sophisticated and integrated manufacturing process. Accordingly, the IPD manufacturing process of the technology TN1 is utilized by the sub-components 100A-100C. In other words, the component 100 resides in the technology TN1. However, the sub-component 210 is metal layer which belongs to low turn coil, and the sophisticated and integrated manufacturing process are not needed for the sub-component 210. As such, the component 200 is arranged on the LGA substrate for the package molding of the technology TN2 to save cost. Therefore, a high accuracy in the IPD manufacturing process and a low cost for the LGA substrate are obtained and synergized by the hybrid passive device 10 of the present invention.

Figure 1B:
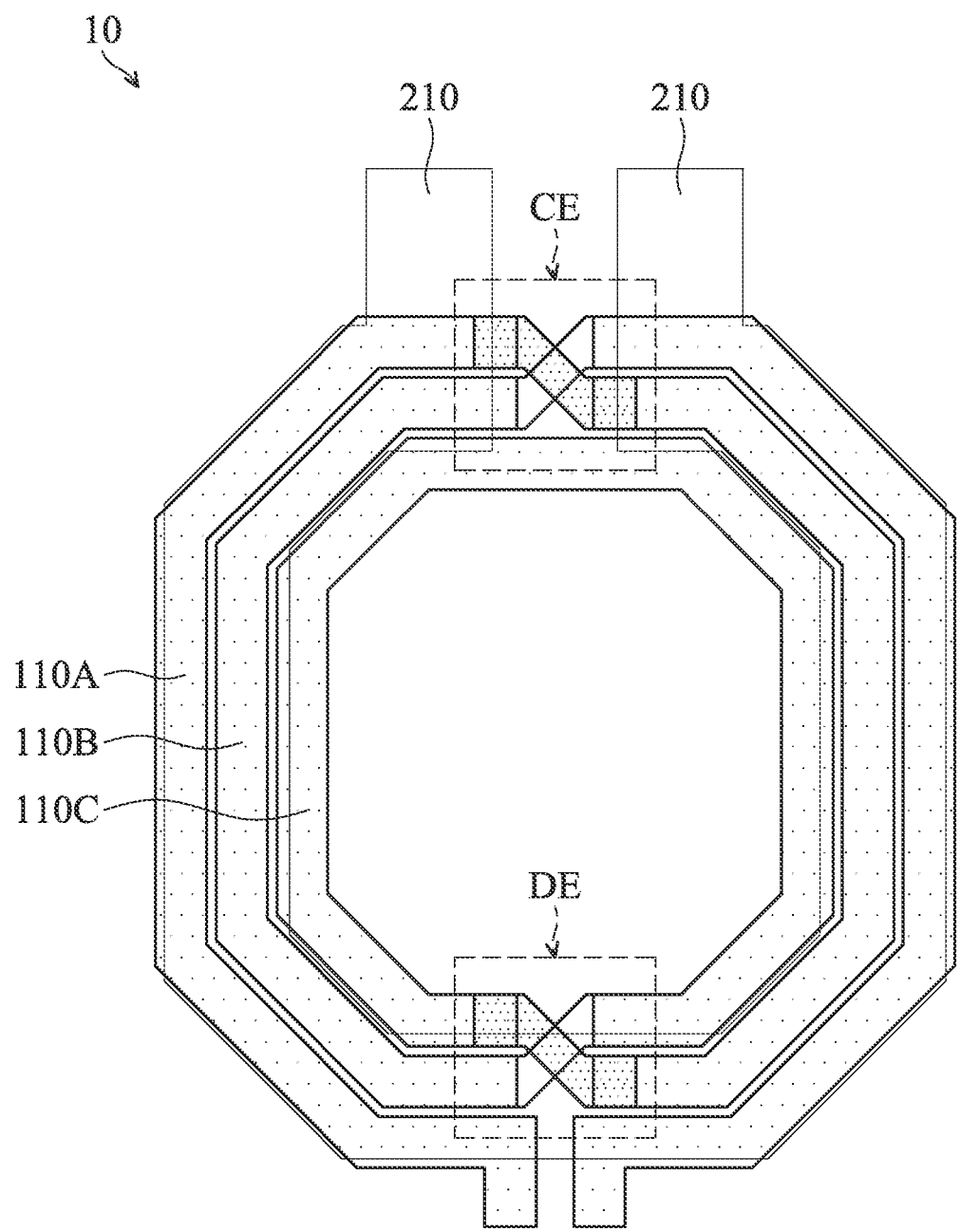
FIG. 1B is a top view of a hybrid passive device according to an embodiment of the invention.

FIG. 1B is a top view of a hybrid passive device 10 according to an embodiment of the invention. The hybrid passive device 10 of the FIG. 1B is the same as the embodiment as shown in FIG. 1A. The hybrid passive device 10 includes three sub-components 100A, 100B and 100C arranged on an upper layer, and includes the sub-component 210 arranged on a lower layer. For example, the sub-components 110A-110C are inductors which are manufactured by the IPD manufacturing process of the technology TN1, and the sub-component 210 is a metal layer on the LGA substrate and resides in the package molding of the technology TN2. It should be noted that the hybrid passive device 10 is a balun device for the conversion between a single end CE and a differential end DE. As shown in FIG. 1B, the single end CE and the differential end DE are arranged in the hybrid passive device 10. The hybrid passive device 10, known as a balun device, could be utilized for converting a differential end DE into a single end CE or, in the reverse situation, a single end CE into a differential end DE. The hybrid passive device 10 could also be utilized for converting a balanced port into an unbalanced port or, in the reverse situation, an unbalanced port into a balanced port. In addition, the hybrid passive device 10 can be manufactured within a flip-chip package. For example, all of the components of the hybrid passive device 10 are manufactured within a flip-chip package for maximizing electromagnetic coupling of the coils and saving the packaging cost. Therefore, the advantages of the synergy of the hybrid passive device 10 could be obtained with flip-chip packaging.

Figure 2A:
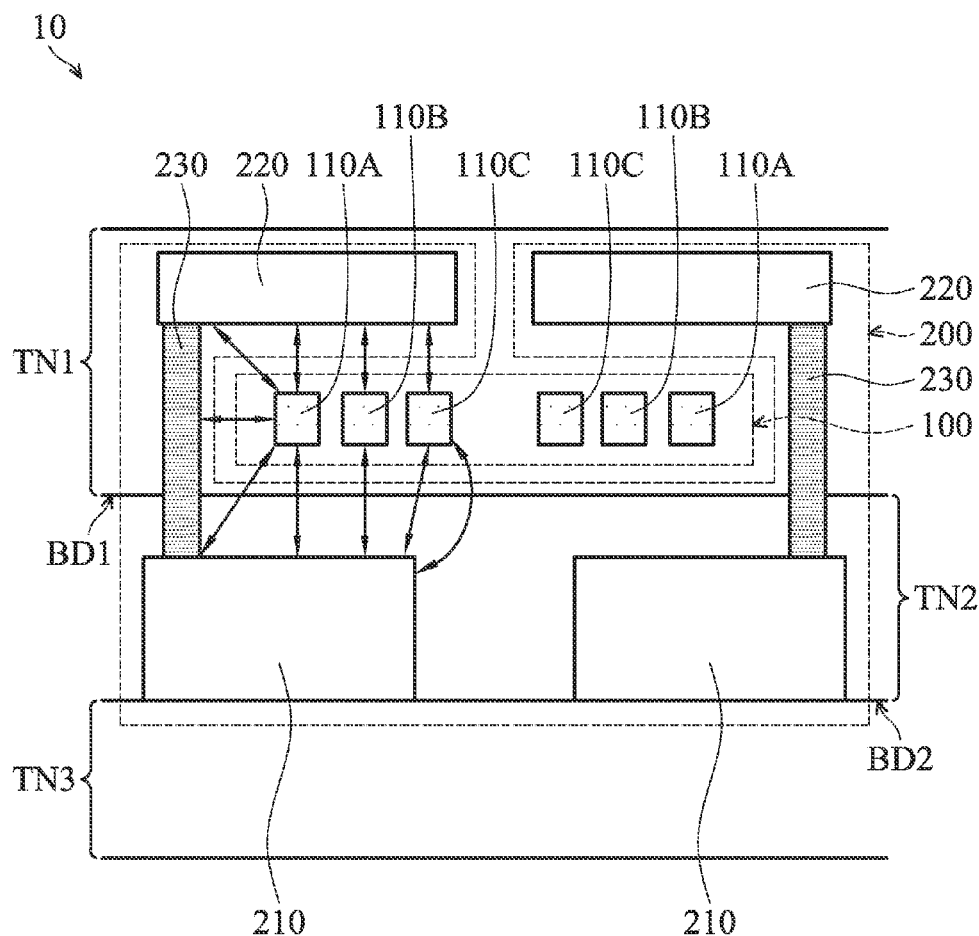
FIG. 2A is a cross-sectional view of a hybrid passive device according to another embodiment of the invention.

FIG. 2A is a cross-sectional view of a hybrid passive device 10 according to another embodiment of the invention. The hybrid passive device 10 of the FIG. 2A is similar to the embodiment as shown in FIG. 1A, the hybrid passive device 10 includes the passive element 100 which resides in the technology TN1, and includes the passive element 200 which resides in the technology TN2. The technology boundary BD1 is arranged between the technologies TN1 and TN2, and the technology boundary BD2 is arranged between the technologies TN2 and TN3. The passive component 100 includes three sub-components 100A, 100B and 100C, and the passive component 200 includes the sub-components 210 and 220.

In this embodiment, the first passive component resides in a first technology, but the second passive component resides in both the first technology and the second technology. When the first passive component and/or the second passive component reside in both the first technology and the second technology, the first passive component and/or the second passive component which reside in both the first technology and the second technology are divided into a first sub-component which resides in the first technology and a second sub-component which resides in the second technology, and the first sub-component is connected to the second sub-component through a conductive link. For example, as shown in FIG. 2A, the second component 200 includes the sub-component 220 (the first sub-component) which resides in the technology TN1 and the sub-component 210 (the second sub-component) which resides in the technology TN2. In other words, the second component 200 resides in both technologies TN1 and TN2.

Furthermore, the sub-component 220 is connected to the sub-component 210 through the conductive link 230. The conductive link 230 is composed of conductive material for carrying conductive currents and interconnecting the technology TN1 and the technology TN2. For example, the conductive link includes a via, a solder bump or a copper pillar for the interconnection through different layers. It should be noted that, in this embodiment, the sub-components 110A-110C are arranged between the sub-components 210 and 220. The first component 100 and the second component 200 are electromagnetically coupled to each other. More specifically, the sub-components 110A-110C and the sub-component 210 are electromagnetically coupled to each other through the technology boundary BD1 since they reside in different technologies TN1 and TN2, and the sub-components 110A-110C and the sub-component 220 are electromagnetically coupled to each other.

Figure 2B:
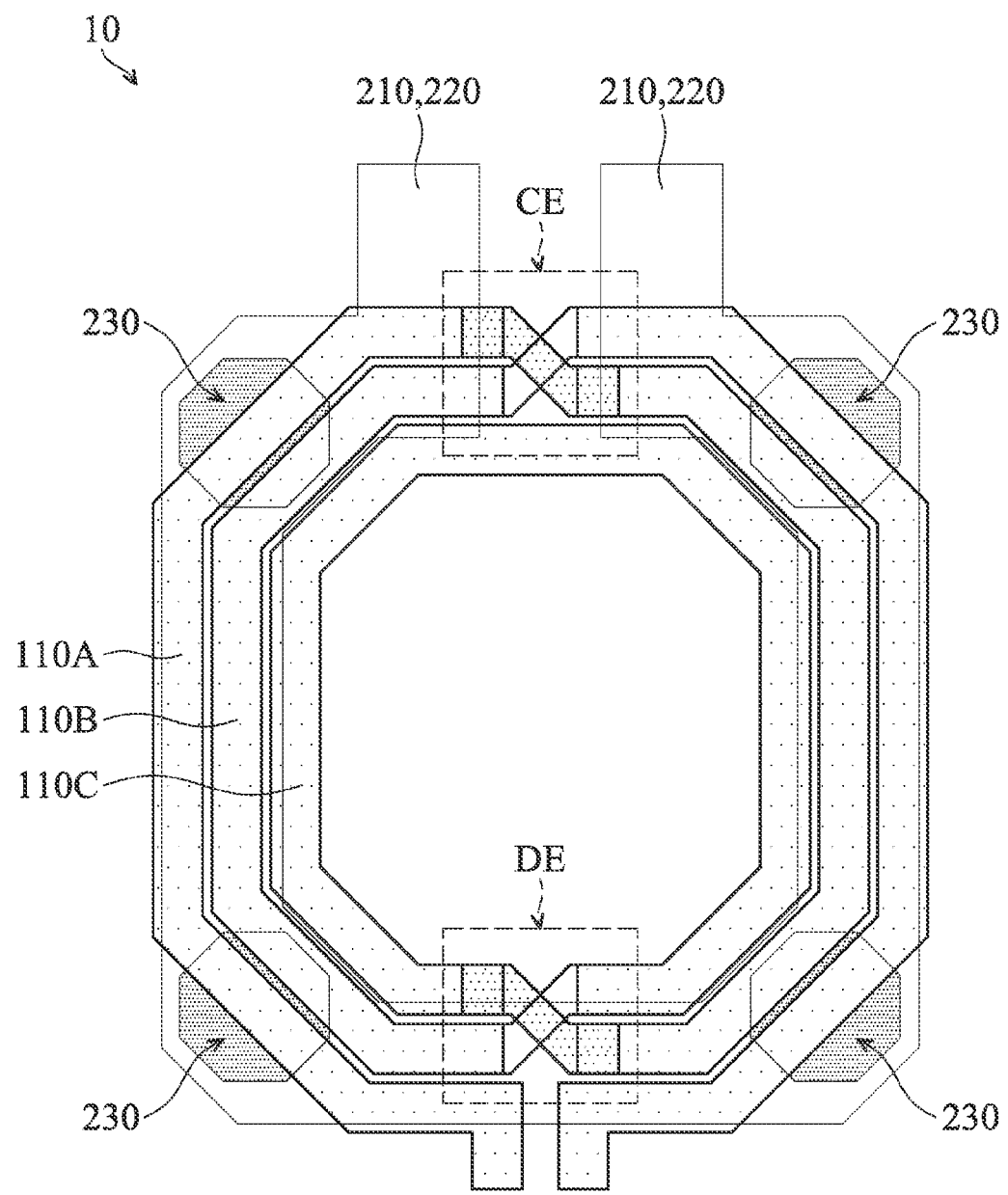
FIG. 2B is a top view of a hybrid passive device according to another embodiment of the invention.

FIG. 2B is a top view of a hybrid passive device 10 according to another embodiment of the invention. The hybrid passive device 10 of the FIG. 2B is the same as the embodiment as shown in FIG. 2A. The hybrid passive device 10 includes three sub-components 100A, 100B and 100C arranged on an upper layer, includes the sub-component 220 arranged on a lower layer, and includes the sub-component 210 arranged on a lower layer. In this embodiment, four conductive links 230 are arranged across the upper layer and the lower layer to connect the sub-components 210 and 220. In addition, the hybrid passive device 10 is a balun device for conversion between the single end CE and the differential end DE.

Figure 3:
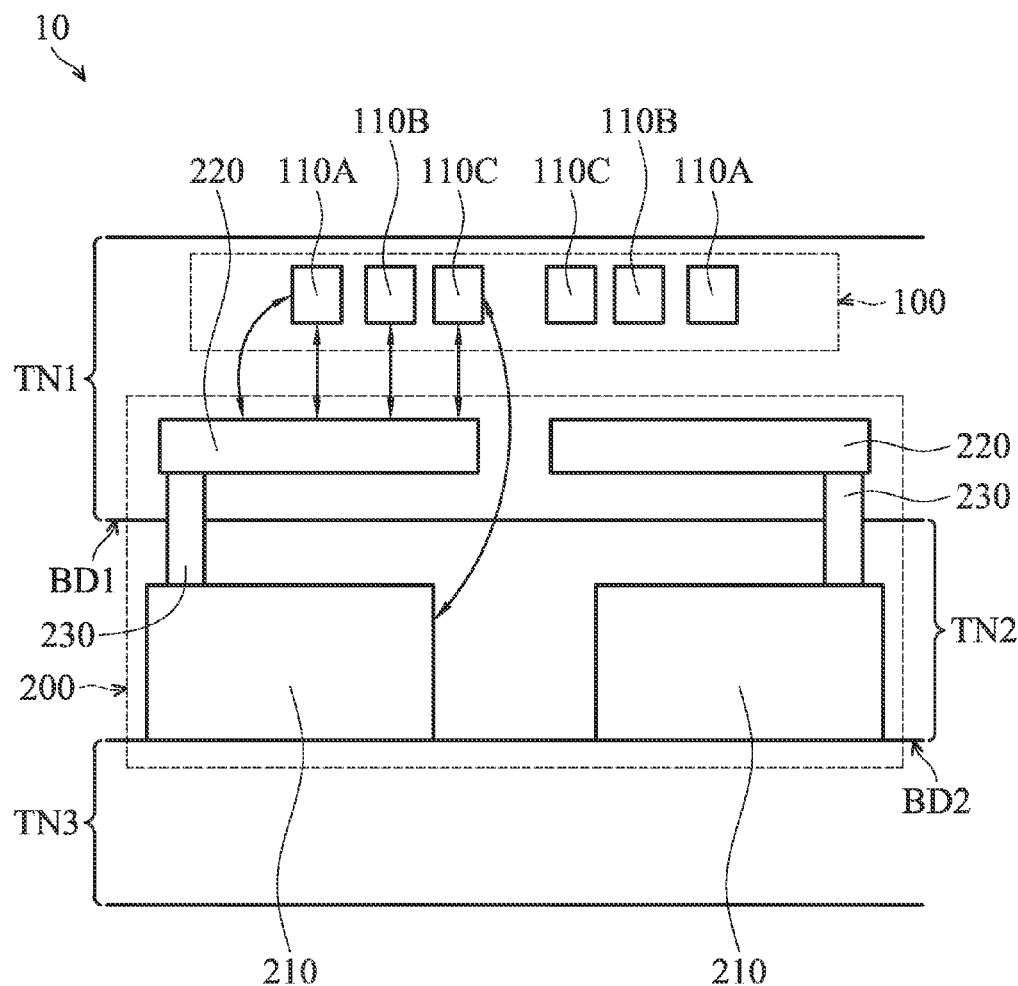
FIG. 3 is a cross-sectional view of a hybrid passive device according to another embodiment of the invention.

FIG. 3 is a cross-sectional view of a hybrid passive device 10 according to another embodiment of the invention. The hybrid passive device 10 of the FIG. 3 is similar to the embodiment as shown in FIG. 2A. The hybrid passive device 10 includes the passive element 100 including the sub-components 110A-110 which reside in the technology TN1, and includes the passive element 200 including the sub-components 220 and 210 which reside in the technologies TN1 and TN2 respectively. The sub-component 220 is connected to the sub-component 210 through the conductive link 230. However, as shown in FIG. 3, the sub-component 220 is arranged between the sub-components 110A-110C and the sub-component 210. It should be noted that such arrangement is only for illustration, not for limiting the present invention. In another embodiment, the sub-components 110A-110C are arranged in the technology TN2 or TN3. In another embodiment, the sub-components 110A-110C are arranged in different technologies TN1, TN2 or TN3. For example, the sub-components 110A resides in the technology TN1, the sub-components 110B reside in the technology TN2, and the sub-component 110C resides in the technology TN3.

Figure 4:
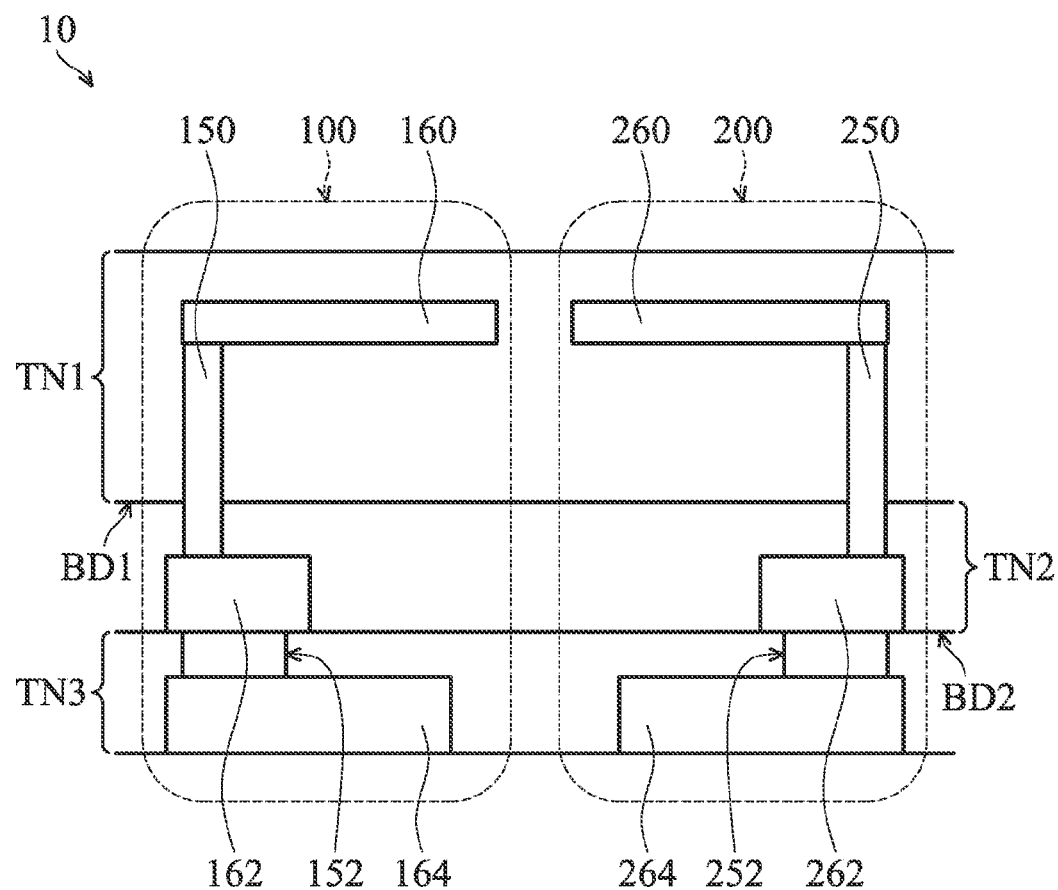
FIG. 4 is a cross-sectional view of a hybrid passive device according to another embodiment of the invention.

FIG. 4 is a cross-sectional view of a hybrid passive device 10 according to another embodiment of the invention. The hybrid passive device 10 includes two passive components 100 and 200 which are electromagnetically coupled to each other. The passive component 100 includes three sub-components 160, 162 and 164 which reside in the technologies TN1, TN2 and TN3 respectively. The conductive link 150 connects the sub-components 160 and 162, and the conductive link 152 connects the sub-components 162 and 164. The passive component 200 includes three sub-components 260, 262 and 264 which reside in the technologies TN1, TN2 and TN3 respectively. The conductive link 250 connects the sub-components 260 and 262, and the conductive link 252 connects the sub-components 262 and 264. For example, the technology TN1 is the CMOS manufacturing process, the technology TN2 is the IPD manufacturing process, and the technology TN3 is an LGA substrate. Therefore, the advantages of different technologies, such as the IPD manufacturing process or the LGA substrate, could be combined and synergized by the hybrid passive device 10 of the present invention.

Figure 5:
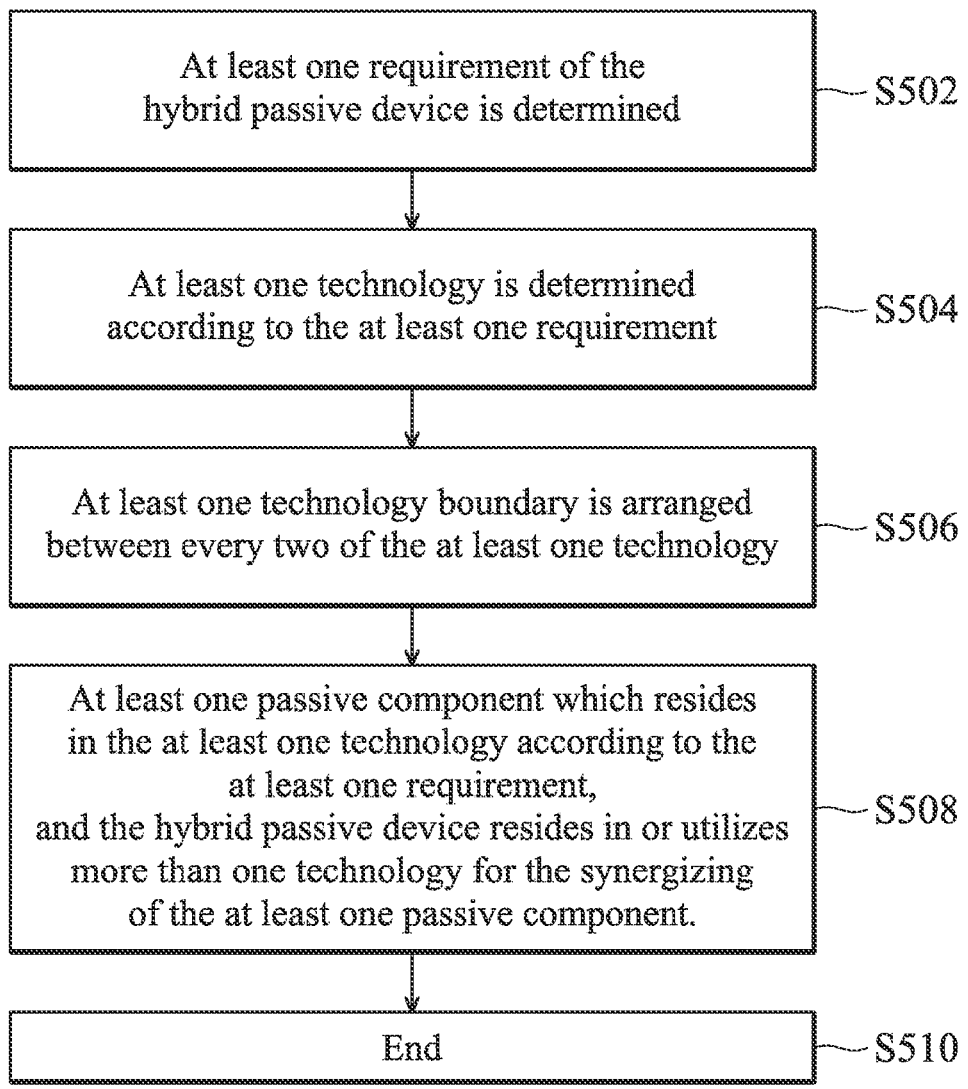
FIG. 5 illustrates a hybrid manufacturing method according to an embodiment of the invention.

FIG. 5 illustrates a hybrid manufacturing method according to an embodiment of the invention. The hybrid manufacturing method is utilized for synergizing at least one passive component which resides in at least one technology. In step S502, at least one requirement of the hybrid passive device is determined. In step S504, at least one technology is determined according to the at least one requirement. The technology includes the substrate technology such as a laminate substrate, an LGA substrate and/or a lead frame, and includes the manufacturing process technology such as an IPD process, a CMOS process, a compound semiconductor process and/or a package molding process. Afterwards, in step S506, at least one technology boundary is arranged between every two of the at least one technology. Afterwards, in step S508, at least one passive component which resides in the at least one technology according to the at least one requirement, and the hybrid passive device resides in or utilizes more than one technology for the synergizing of the at least one passive component. For example, the passive components could be any kind of metal structures in the form of coil, sheet, straight line, meander line, layer and metal of arbitrary geometry. Afterwards, the hybrid manufacturing method ends in step S510.

Figure 6:
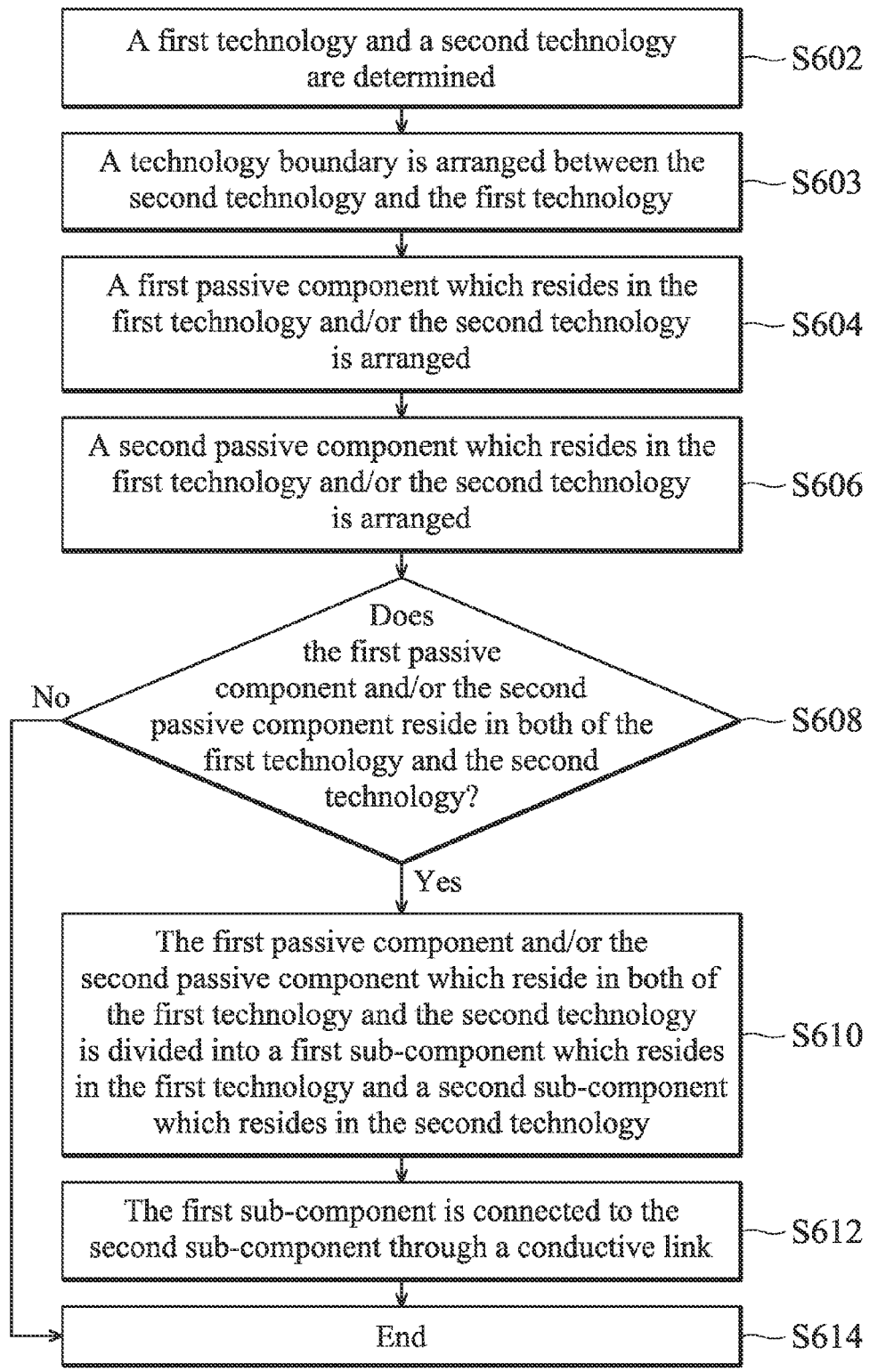
FIG. 6 illustrates a hybrid manufacturing method according to another embodiment of the invention.

FIG. 6 illustrates a hybrid manufacturing method according to another embodiment of the invention for synergizing at least one passive component which resides in at least one technology. In step S602, a first technology and a second technology are determined. In step S603, a technology boundary is arranged between the second technology and the first technology. Afterwards, step S604 is executed so that a first passive component which resides in the first technology and/or the second technology is arranged, and step S606 is executed so that a second passive component which resides in the first technology and/or the second technology is arranged. In step S608, whether or not the first passive component and/or the second passive component reside in both the first technology and the second technology is determined. If the first passive component and/or the second passive component do not reside in both the first technology and the second technology is determined, the hybrid manufacturing method ends as shown in step S614. If the first passive component and/or the second passive component reside in both the first technology and the second technology is determined, step S610 is executed. In step S610, the first passive component and/or the second passive component which reside in both the first technology and the second technology are divided into a first sub-component which resides in the first technology and a second sub-component which resides in the second technology. Afterwards, step S612 is executed so that the first sub-component is connected to the second sub-component through a conductive link. The conductive link is composed of conductive material for carrying conductive currents and interconnecting the first technology and the second technology such as a via, a solder bump or a copper pillar. Afterwards, the hybrid manufacturing method ends in step S614.

Figure 7:
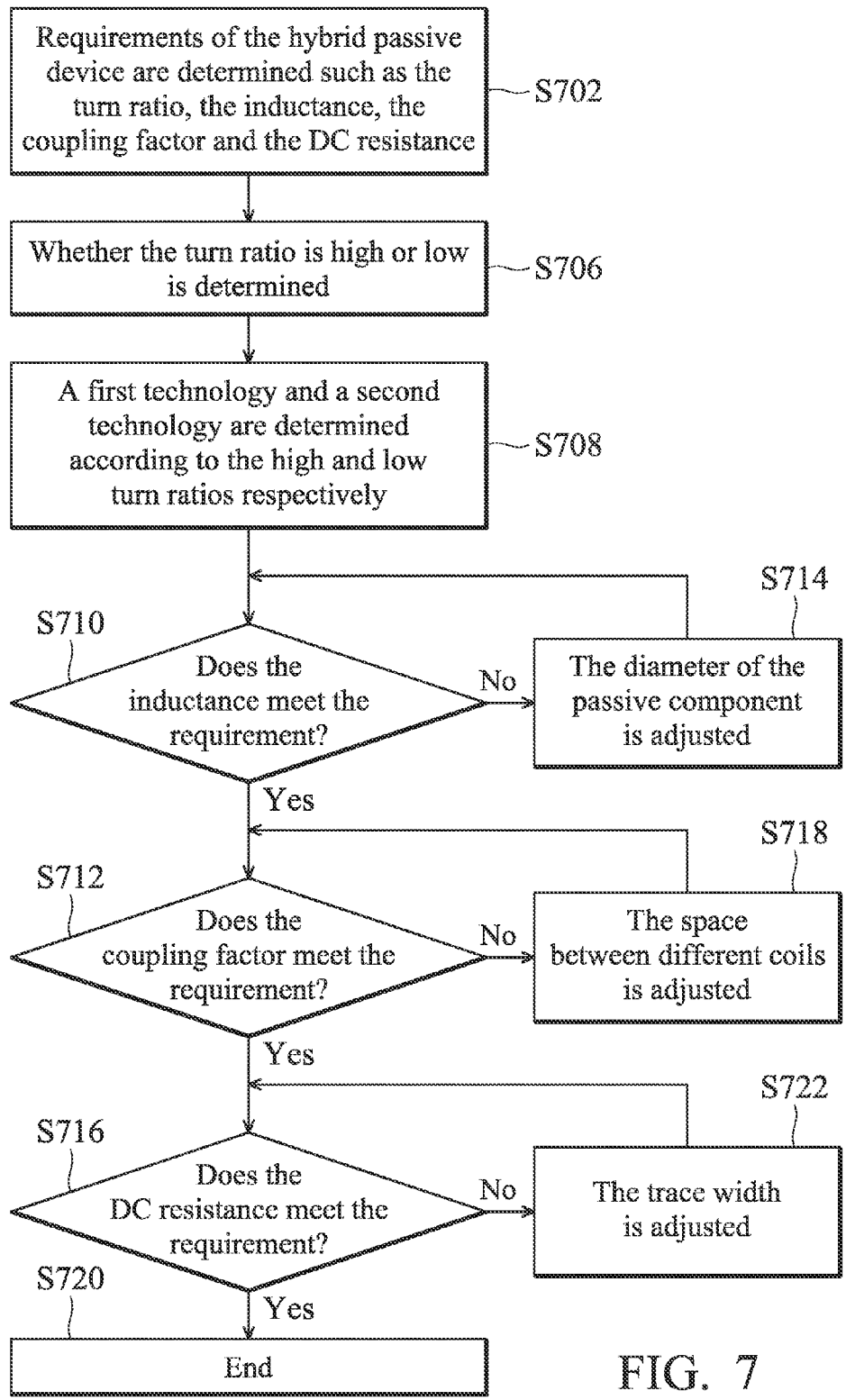
FIG. 7 illustrates a hybrid manufacturing method according to another embodiment of the invention.

FIG. 7 illustrates a hybrid manufacturing method according to another embodiment of the invention for synergizing at least one passive component which resides in at least one technology. In step S702, requirements of the hybrid passive device are determined such as the turn ratio, the inductance, the coupling factor and the DC resistance. In step S706, whether the turn ratio is high or low is determined. Afterwards, in step S708, a first technology and a second technology are determined according to the high and low turn ratios respectively. For example, if the passive component is a high-turn coil, the sophisticated and integrated manufacturing process will be required such as the IPD manufacturing process. If the passive component belongs to a low-turn coil, layer-limited process will be suitable such as the LGA substrate.

Afterwards, in step S710, whether the inductance of the passive component meets the requirement or not is determined. If the inductance of the passive component does not meet the requirement, step S714 is performed so that the diameter of the passive component is adjusted. If the inductance of the passive component meets the requirement, step S712 is executed so that whether the coupling factor meets the requirement or not is determined. If the coupling factor does not meet the requirement, step S718 is performed so that the space between different coils is adjusted. The space between different passive components could be changed. Furthermore, the low-turn coil could be shunted low with high-turn coils on the sophisticated and integrated manufacturing process. In addition, if the coupling factor meets the requirement, step S716 is performed. In step S716, whether the DC resistance of the passive component meets the requirement or not is determined. If the DC resistance of the passive component does not meet the requirement, step S722 is executed so that the trace width is adjusted. More specifically, the DC resistance can be increased by decreasing the trace width, or decreased by increasing the trace width. Furthermore, the DC resistance of the LGA substrate is lower than the DC resistance of the IPD manufacturing process. Therefore, the DC resistance of the passive component can be adjusted to meet the requirement. If the DC resistance of the passive component meets the requirement, step S720 is executed for ending the hybrid manufacturing method. It should be noted that the hybrid manufacturing method of FIG. 7 is only for illustration, not for limiting the present invention. The sequence of the steps S710~S722 could be changed based on the design and requirements of the passive electronic device. For example, after the coupling factor of the passive component is checked, the inductance and the DC resistance of the passive component are checked.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements. While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A hybrid manufacturing method for synergizing at least one passive component which resides in at least one technology, comprising:
   determining a first technology and a second technology of the at least one technology and a technology boundary, wherein the second technology is different from the first technology, and a technology boundary is arranged between the second technology and the first technology;
   arranging a first passive component of the at least one passive component which resides in the first technology and/or the second technology; and
   arranging a second passive component of the at least one passive component which is different from the first passive component, wherein the second passive component resides in the first technology and/or the second technology, and the first passive component and the second passive component are electromagnetically coupled to each other through the technology boundary, further comprising when the first passive component and/or the second passive component reside in both the first technology and the second technology, dividing the first passive component and/or the second passive component which reside in both the first technology and the second technology into a first sub-component which resides in the first technology and a second sub-component which resides in the second technology, and connecting the first sub-component and the second sub-component through a conductive link.

2. A hybrid passive device for synergizing at least one passive component which resides in at least one technology, comprising:
   a first passive component of the at least one passive component, wherein the first passive component resides in a first technology of the at least one technology and/or a second technology of the at least one technology, the second technology is different from the first technology, and a technology boundary is arranged between the second technology and the first technology; and
   a second passive component of the at least one passive component which is different from the first passive component, wherein the second passive component resides in the first technology and/or the second technology, and the first passive component and the second passive component are electromagnetically coupled to each other through the technology boundary, wherein when the first passive component and/or the second passive component reside in both the first technology and the second technology, the first passive component and/or the second passive component which reside in both the first technology and the second technology are divided into a first sub-component which resides in the first technology and a second sub-component which resides in the second technology, and the first sub-component is connected to the second sub-component through a conductive link.

3. The hybrid passive device as claimed in claim 2, wherein the conductive link is composed of conductive material for carrying conductive currents and interconnecting the first technology and the second technology.

4. The hybrid passive device as claimed in claim 3, wherein the conductive link comprises a via, solder bump or a copper pillar.

5. A hybrid passive device for synergizing at least one passive component which resides in at least one technology, comprising:
   a first passive component of the at least one passive component, wherein the first passive component resides in a first technology of the at least one technology and/or a second technology of the at least one technology, the second technology is different from the first technology, and a technology boundary is arranged between the second technology and the first technology; and
   a second passive component of the at least one passive component which is different from the first passive component, wherein the second passive component resides in the first technology and/or the second technology, and the first passive component and the second passive component are electromagnetically coupled to each other through the technology boundary;
   wherein, the first passive component and the second passive component include metal structures which are surrounded by dielectrics of the first technology and/or the second technology, the technology boundary is a plane for contacting the dielectrics of the first technology and/or the second technology, and a first element in the first technology and a second element in the second technology are electrically connected through a conductive link.

6. The hybrid passive device as claimed in claim 5, wherein the first passive component and the second passive component comprise metal structures which are surrounded by dielectrics of the first technology and/or the second technology.

7. The hybrid passive device as claimed in claim 6, wherein the technology boundary is a plane for contacting the dielectrics of the first technology and/or the second technology.

8. The hybrid passive device as claimed in claim 5, wherein the first technology and the second technology comprise a substrate technology in which the first and second passive components reside and/or comprises a manufacturing process technology to be utilized by the first and second passive components.

9. The hybrid passive device as claimed in claim 8, wherein the substrate technology comprises a laminate substrate, an LGA substrate and/or a lead frame.

10. The hybrid passive device as claimed in claim 8, wherein the manufacturing process technology comprises an IPD manufacturing process, a CMOS manufacturing process, a compound semiconductor process and/or a package molding process.

11. The hybrid passive device as claimed in claim 5, wherein the electromagnetic coupling between the first passive component and the second passive component comprises an inductive coupling for sharing magnetic field lines and a capacitive coupling for sharing electrical field lines.

12. The hybrid passive device as claimed in claim 5, wherein the hybrid passive device is manufactured within a flip-chip package.

13. The hybrid passive device as claimed in claim 5, wherein the hybrid passive device is a balun device for the connective conversion between a single end and a differential end.

14. A hybrid manufacturing method for synergizing at least one passive component which resides in at last one technology, comprising:
   determining a first technology and a second technology of the at least one technology and a technology boundary, wherein the second technology is different from the first technology, and a technology boundary is arranged between the second technology and the first technology;

arranging a first passive component of the at least one passive component which resides in the first technology and/or the second technology; and arranging a second passive component of the at least one passive component which is different from the first passive component, wherein the second passive component resides in the first technology and/or the second technology, and the first passive component and the second passive component are electromagnetically coupled to each other through the technology boundary;

wherein, the first passive component and the second passive component include metal structures which are surrounded by dielectrics of the first technology and/or the second technology, the technology boundary is a plane for contacting the dielectrics of the first technology and/or the second technology, and a first element in the first technology and a second element in the second technology are electrically connected through a conductive link.

15. The hybrid manufacturing method as claimed in claim 14, wherein the first passive component and the second passive component comprise metal structures which are surrounded by dielectrics of the first technology and/or the second technology.

16. The hybrid manufacturing method as claimed in claim 15, wherein the technology boundary is a plane for contacting the dielectrics of the first technology and/or the second technology.

17. The hybrid manufacturing method as claimed in claim 14, wherein the first technology and the second technology comprise a substrate technology in which the first and second passive components reside and/or comprises a manufacturing process technology to be utilized by the first and second passive components.

18. The hybrid manufacturing method as claimed in claim 17, wherein the substrate technology comprises a laminate substrate, an LGA substrate and/or a lead frame.

19. The hybrid manufacturing method as claimed in claim 17, wherein the manufacturing process technology comprises an IPD manufacturing process, a CMOS manufacturing process, a compound semiconductor process and/or a package molding process.

20. The hybrid manufacturing method as claimed in claim 14, wherein the electromagnetic coupling between the first passive component and the second passive component comprises an inductive coupling for sharing magnetic field lines and a capacitive coupling for sharing electrical field lines.

* * * * *